(12) United States Patent
Hold

(10) Patent No.: US 9,064,561 B2
(45) Date of Patent: Jun. 23, 2015

(54) HANDLING OF WRITE OPERATIONS WITHIN A MEMORY DEVICE

(75) Inventor: Betina Hold, El Dorado Hills, CA (US)

(73) Assignee: ARM Limited, Cambridge (GB)

(*) Notice: Subject to any disclaimer, the term of this patent is extended or adjusted under 35 U.S.C. 154(b) by 513 days.

(21) Appl. No.: 13/437,373

(22) Filed: Apr. 2, 2012

(65) Prior Publication Data

US 2013/0258760 A1    Oct. 3, 2013

(51) Int. Cl.
| | | |
|---|---|---|
| *G11C 7/02* | (2006.01) | |
| *G11C 11/00* | (2006.01) | |
| *G11C 11/412* | (2006.01) | |
| *G11C 11/419* | (2006.01) | |
| *G11C 7/22* | (2006.01) | |
| *G11C 7/10* | (2006.01) | |

(52) U.S. Cl.
CPC .............. *G11C 11/00* (2013.01); *G11C 7/1006* (2013.01); *G11C 7/1078* (2013.01); *G11C 11/412* (2013.01); *G11C 11/419* (2013.01); *G11C 7/227* (2013.01)

(58) Field of Classification Search
USPC .............................. 365/210.1, 230.01, 189.16
See application file for complete search history.

(56) References Cited

U.S. PATENT DOCUMENTS

| 6,483,754 B1* | 11/2002 | Agrawal .................. 365/189.04 |
| 7,339,842 B1 | 3/2008 | Hold |
| 2008/0112245 A1* | 5/2008 | Ostermayr et al. ........ 365/210.1 |

OTHER PUBLICATIONS

Raychowdury et al., "Tunable Replica Bits for Dynamic Variation Tolerance in 8T SRAM Arrays", *IEEE Journal of Solid-State Circuits*, vol. 46, No. 4, Apr. 2001, pp. 797-785.

* cited by examiner

*Primary Examiner* — Han Yang
(74) *Attorney, Agent, or Firm* — Nixon & Vanderhye P.C.

(57) ABSTRACT

A memory device includes an array of memory cells arranged into a plurality of rows and columns and having a plurality of word lines and a plurality of bit lines passing through the array. The memory cells in each row are activated via a word line signal on the corresponding word line, and the memory cells in each column are coupled to an associated bit line pair via which data is written into an activated memory cell of the column during a write operation and data is read from the activated memory cell of the column during a read operation. A dummy column of dummy memory cells is provided and includes a plurality of loading dummy memory cells for providing a load to the at least one dummy bit line, and at least one write timing dummy memory cell coupled to a dummy word line.

16 Claims, 7 Drawing Sheets

HANDLING OF WRITE OPERATIONS WITHIN A MEMORY DEVICE

BACKGROUND OF THE INVENTION

1. Field of the Invention

The present invention relates to a memory device comprising an array of memory cells, and a method of operation of such a memory device, and in particular to a technique for determining when a write operation has completed within the addressed memory cells of the memory device.

2. Description of the Prior Art

As process geometries shrink in modern data processing systems, the variability in the operating characteristics of the individual circuit elements increases. Considering as an example a memory device consisting of an array of memory cells, it will be understood that each memory cell will typically consist of a number of electronic components such as transistors, and the variability in those individual components significantly increases as process geometries shrink. Furthermore, there is an increasing desire to operate data processing systems at lower and lower supply voltages, and as the supply voltage decreases, reliability issues due to the variations in the individual components become more prominent.

In order to ensure correct operation of a memory, memory system designers normally operate the memory system to ensure that when a write operation is performed, the addressed memory cells remain enabled, and the write data remains asserted, for a period of time sufficient to ensure that all of the addressed memory cells will have updated their internal state to correctly reflect the write data before the write operation is terminated, and in particular the period of time allowed for completion of the write operation is chosen having regard to a worst case set of assumptions surrounding manufacturing variation, ambient conditions, etc associated with the memory system concerned. Hence, a memory system designer will calculate a slowest likely write speed and then add a certain safety margin to this when deciding at what speed the memory should be operated. Whilst this approach is safe in terms of ensuring correct operation and data integrity, it can significantly limit the data processing performance that may be achieved.

Furthermore, given the increase in variability of components that occurs as process geometries shrink, this will then lead to larger margins needing to be specified in order to ensure correct operation.

Traditionally, many of the techniques for controlling the timing of a write operation have been derived from techniques used to control the timing of a read operation within the memory cell. When considering a read operation, sense amplifiers connected to the various bit lines are arranged to sample the voltages on those bit lines when triggered to do so by a sense amplifier enable signal. Various techniques have been developed for determining when to generate such a sense amplifier enable signal, for example by using self-timed read paths. Commonly owned U.S. Pat. No. 7,339,842 describes one such self-timed read path technique for generating a sense amplifier enable signal.

One known technique for controlling the timing of a write operation is to use the signal generated by the self-timed read path to act as a termination signal for the write operation. Traditionally, such an approach has been acceptable since it was typically the case that the timing of read operations was more critical, as these typically took longer than write operations and hence were performance limiting. By the time a termination signal was generated by the self-timed read path, it could be ensured that the write operation would have completed. However, as process geometries shrink in modem data processing systems, the performance of write operations is becoming more critical, and indeed write operations can in fact take longer than read operations. One known enhancement to the above approach (employed for example by ARM Limited of Cambridge, United Kingdom) is to use the self-timed read path for timing of write operations, and thus assume by default that the write time is equal to the read time, but to then optionally extend the write time with varying delay elements set/programmed by external pins (either at SoC design time or dynamically). This can hence accommodate situations where write operations take longer than read operations. However, the approach still has the disadvantage that it tracks write timing based on a self-timed read path. Accordingly, there is a need to find improved techniques for tracking the time taken for write operations to complete.

The article "Tunable Replica Bits for Dynamic Variation Tolerance in 8T SRAM Arrays", by Arijit Raychowdhury et al, IEEE Journal of Solid-State Circuits, Volume 46, No. 4, April 2011, page 797 to 805, describes a design of tunable replica bits (TRBs) used to alleviate a significant portion of the Vcc guardband within a memory array based on 8T SRAM cells. Tunable replica bits are described for both read operations and write operations. However, the described design employs a single bit cell as the replica cell, and in practice this can give rise to a large degree of variability in the circuit, reducing accuracy. In addition, the single bit cell replica cell is tuned using an external voltage, which requires the provision of extra reference voltages to the circuit. Furthermore, such an approach does not capture the true characteristics of a write operation, since it is not based on mimicking the activities that actually occur within the individual bit cells of the memory array. In particular, when considering the operations that occur at the bit cell level, consideration has to be given to the analogue effects that occur due to the flipping of state within the individual bit cells, for example the dependence on threshold voltage Vt and current strength of each device, as well as the feedback loop which directly enables and fights the change of state required during a write operation. In addition, the approach described in the paper would need to be optimised for any particular memory instance, and hence does not provide a solution that provides the required flexibility for adoption within the memory compiler space. Other problems with this prior art approach is that the described technique focuses on determining read and write Vmin based on a process monitor type circuit having some bitcells in it, but it does not focus on tracking timing in a real memory device, and does not have any mechanism for observing real path effects in a memory device. In addition the approach adds a significant area overhead in order to support dynamic tuning.

Accordingly, it would be desirable to provide an improved technique for increasing the performance of write operations within a memory device.

SUMMARY OF THE INVENTION

Viewed from a first aspect, the present invention provides a memory device comprising: an array of memory cells arranged into a plurality of rows and columns and having a plurality of word lines and a plurality of bit lines passing through the array, the memory cells in each row being activated via a word line signal on the corresponding word line, and the memory cells in each column being coupled to an associated at least one bit line via which data is written into an activated memory cell of the column during a write operation and data is read from an activated memory cell of the column during a read operation; control circuitry configured to control signals supplied to the word lines and bit lines of the array in order to control said write operation and said read operation; a dummy column of dummy memory cells associated with said array, said dummy column including at least one dummy bit line to which said dummy memory cells are connected, the dummy memory cells including a plurality of loading dummy memory cells for providing a load to said at least one dummy bit line, and at least one write timing dummy memory cell coupled to a dummy word line; dummy write driver circuitry coupled to said at least one dummy bit line; the control circuitry being configured, during said write operation, to activate each of said at least one write timing dummy memory cell via the dummy word line, and to cause the dummy write driver circuitry to control a voltage on the at least one dummy bit line so as to cause a state flip condition to occur within said at least one write timing dummy memory cell; and write detection circuitry configured, on occurrence of the state flip condition, to issue a write terminate signal to the control circuitry to terminate the write operation.

In accordance with the present invention, a dummy column of dummy memory cells is provided in association with the memory array. The dummy memory cells include a plurality of loading dummy memory cells for providing a load to at least one dummy bit line running through the dummy column, and in addition at least one write timing dummy memory cell is provided within the dummy column. Each such write timing dummy memory cell is coupled to a dummy word line.

During a write operation, each write timing dummy memory cell is activated via the dummy word line and dummy write driver circuitry causes a voltage on at least one dummy bit line to change so as to cause a state flip condition to occur within each write timing dummy memory cell. This state flip condition is detected, thus causing a write terminate signal to be issued to the control circuitry to terminate the write operation.

The number of write timing dummy memory cells used is a matter of design choice, and indeed in one embodiment that number is programmable at design time. In one particular implementation, it has been found that the use of two write timing dummy memory cells provides an appropriate level of drive strength to cause the state flip condition to occur with the desired speed following the start of the write operation. In an alternative embodiment, the number of write timing dummy memory cells can be set at runtime by appropriate control logic, and hence changed dynamically.

By appropriate timing of the state flip condition within the dummy column, it can be ensured that, taking into account the time taken to propagate the write terminate signal to the control circuitry, and the time taken for the control circuitry to then de-assert the write enable signal(s) provided to the memory array, the write terminate signal is generated such that by the time the control circuitry terminates the write operation, the addressed memory cell exhibiting the worst-case write timing (i.e. the cell taking the longest to complete the write operation due for example to the loading on its bit lines and/or the time taken to propagate the write enable signal to that addressed memory cell) has updated its stored internal state correctly having regards to the write data.

Whilst in some implementations the dummy column may use only a single dummy bit line, in one embodiment the at least one dummy bit line comprises a first dummy bit line and a second dummy bit line, with the dummy write driver circuitry being connected to the first dummy bit line, and the write detection circuitry being connected to the second dummy bit line. Hence, in such embodiments, the dummy write driver circuitry is configured during the write operation to cause a change in voltage on the first dummy bit line, which causes each write timing dummy memory cell to flip its internal state whilst also pulling the voltage on the second dummy bit line to its opposite state, that change in voltage on the second dummy bit line being treated by the write detection circuitry as being indicative of the state flip condition having occurred.

In one embodiment, the memory device further comprises dummy precharge circuitry configured to precharge the first dummy bit line to a first voltage level and the second dummy bit line to a second voltage level. The dummy write driver circuitry is configured during the write operation to drive the first dummy bit line towards the second voltage level, and the write detection circuitry is configured to detect the state flip condition by detecting when a change in the internal stored state of said at least one write timing dummy memory cell causes the voltage on the second dummy bit line to transition from the second voltage level towards the first voltage level.

The choice of the first and second voltages is a matter of design choice having regard to a particular implementation of the dummy column. However, in one embodiment, the first voltage is a logic one level voltage and the second voltage is a logic zero level voltage.

In one embodiment, the number of write timing dummy memory cells provided in the dummy column is chosen so as to provide sufficient drive strength to pull the voltage on the second dummy bit line from the second voltage level towards the first voltage level during the write operation. However, in one embodiment, flip assist circuitry can also be provided in association with the dummy column to assist the write timing dummy memory cells in performing that transition of the voltage on the second dummy bit line. The flip assist circuitry will be configured so that it does not have enough drive strength in itself to perform that transition, so as to ensure that the transition is truly resulting from the state flip condition within the write timing dummy memory cells, but the flip assist circuitry can enable that change in voltage to occur more quickly, and accordingly for the write terminate signal to be generated more quickly.

Another technique that can be used to improve the speed of detection of the state flip condition by the write detection circuitry is to separate the second dummy bit line into first and second portions, with the first portion being connected to the at least one write timing dummy memory cell, and the second portion bring connected to the plurality of loading dummy memory cells. The write detection circuitry is then connected to the first portion of the second dummy bit line. In such an arrangement, whilst the loading dummy memory cells provide a representative load to the first dummy bit line that is being driven by the dummy write driver circuitry, they do not contribute to the load on the first portion of the second dummy bit line, and accordingly that first portion of the second dummy bit line can be transitioned towards the first voltage level more quickly, thereby leading to an earlier detection of the state flip condition by the write detection circuitry.

The dummy memory cells can take a variety of forms, but in one embodiment are constructed using the same memory cells used in the memory array. In one particular embodiment, each dummy memory cell is a six transistor (6T) SRAM cell including first and second pass gates for coupling the memory cell to the first and second dummy bit lines, and each write timing dummy memory cell is configured to have its first pass gate controlled by a signal on the dummy word line to connect the write timing dummy memory cell to the first dummy bit line during the write operation. Accordingly, each write timing dummy memory cell is connected in parallel to the first dummy bit line during the write operation.

In one particular embodiment, each write timing dummy memory cell is configured to have its second pass gate bypassed such that the write timing dummy memory cell is permanently connected to the second dummy bit line. This provides for a simplified physical design, since it is possible during physical layout of the device to actually connect the second pass gates of each write timing dummy memory cell to an appropriate one of the word lines running through the memory array, but without the operation of the write timing dummy memory cells being affected by the voltages on those word lines. Instead, each write timing dummy memory cell is activated purely by the voltage provided on the dummy word line.

The loading dummy memory cells can be configured in a variety of ways. However, in one embodiment, each loading dummy memory cell has both of its first and second pass gates permanently turned off so that the stored state within that loading dummy memory cell is not affected by the voltage on the first and second dummy bit lines. In one particular embodiment, this is achieved by connecting the gate of both the first and second pass gates to ground, but it will be appreciated that in alternative embodiments other mechanisms can be used to disable the operation of the first and second pass gates, for example by breaking the connection between a pass gate and its associated bit line.

Whilst in one embodiment the loading dummy memory cells can be arranged to always store the same data values, in an alternative embodiment a mechanism is provided to enable the data stored in the loading dummy memory cells to be programmed so as to represent a worst case load condition on the at least one dummy bit line during the write operation. In particular, in one embodiment the memory device further comprises state control circuitry configured to supply dual supply voltages to the plurality of loading dummy memory cells and to control the supply voltage values of said dual supply voltages in order to set the data values stored in the plurality of loading dummy memory cells to act as a worst case load condition on the at least one dummy bit line during the write operation. Accordingly, by way of example, the data values can be set in the loading dummy memory cells so that they act to resist the transition in voltage being driven onto the first dummy bit line by the dummy write driver circuitry during the write operation, thereby slowing the speed of that transition in voltage on the first dummy bit line. This ensures that the timing within the dummy memory cell can be tuned having regard to the worst case expected timing within the actual memory array.

In addition to providing the above-described dummy column of dummy memory cells to act as a self-timed write control circuit, it will also often be desirable to provide some self-timed read control circuitry within the memory device to control the timing of read operations. Whilst any of a number of known techniques may be used to implement such self-timed read control circuitry, in one embodiment such self-timed read control circuitry can be incorporated within the design of the dummy column, thereby providing an elegant and space efficient solution for providing both self-timed write control and self-timed read control.

In particular, in one embodiment, the dummy memory cells include at least one read timing dummy memory cell coupled to said dummy word line, and the control circuitry is configured, during the read operation, to activate each of said at least one read timing dummy memory cell via a signal on the dummy word line and a read enable signal. Said at least one read timing dummy memory cell is configured, when activated, to cause a voltage on said at least one dummy bit line to transition from a first voltage level towards a second voltage level, and the memory device further comprises read detection circuitry configured, on detection of the voltage on said at least one dummy bit line transitioning towards said second voltage level during said read operation, to issue a read terminate signal to the control circuitry to terminate the read operation. Hence, in such embodiments, three types of dummy cell are included within the dummy column, namely the loading dummy cells, one or more write timing dummy cells, and one or more read timing dummy cells. As with the write timing dummy cells, in one embodiment the number of read timing dummy cells provided in the dummy column is programmable at design time. In one particular implementation, it has been found that six read timing dummy cells provide the desired drive strength to cause the voltage on the at least one dummy bit line to transition towards the second voltage level quickly enough to result in the generation of a read terminate signal that can be used to terminate the read operation at an appropriate time having regard to the slowest memory cell within the memory array.

In one embodiment, each read timing dummy cell comprises a six transistor (6T) SRAM memory cell having four transistors disabled, such that the remaining two transistors are coupled in series between said at least one dummy bit line and the second voltage level. Dummy precharge circuitry is configured to precharge said at least one dummy bit line to the first voltage level prior to the read operation, and during the read operation, one of the remaining two transistors is turned on by the read enable signal and the other of the remaining two transistors is turned on by the signal on the dummy word line. By constructing the read timing dummy memory cells out of the standard 6T SRAM memory cells, this provides for a simple design.

In one particular embodiment, the memory device further comprises state control circuitry configured to supply dual supply voltages to the plurality of loading dummy memory cells and to control the supply voltage values of said dual supply voltages in order to set the data values stored in the plurality of loading dummy memory cells to act as a worst case load condition on the at least one dummy bit line during the read operation. Hence, in a similar way to the embodiment that used the state control circuitry during the write operation, in this embodiment the data stored in the loading dummy memory cells can be programmed so as to replicate the worst case data condition within a column of the actual memory array, i.e. the condition that would cause the slowest reading of the data from the addressed memory cell in that column.

The dummy word line can be configured in a variety of ways. However, in one embodiment, the dummy word line is routed so as to provide a delay in propagation of an activation signal to the at least one write timing dummy memory cell having regard to a worst case propagation delay of a corresponding activation signal sent to an addressed memory cell within the array. In one particular embodiment, this is achieved by routing the dummy word line so as to pass halfway along the length of a row within the memory array, and then double back along that length before being provided as an input to the dummy column.

Viewed from a second aspect, the present invention provides a method of controlling timing of a write operation within a memory device comprising an array of memory cells arranged into a plurality of rows and columns and having a plurality of word lines and a plurality of bit lines passing through the array, the memory cells in each row being activated via a word line signal on the corresponding word line, and the memory cells in each column being coupled to an associated at least one bit line via which data is written into an activated memory cell of the column during a write operation and data is read from an activated memory cell of the column during a read operation, the memory device further having control circuitry for controlling signals supplied to the word lines and bit lines of the array in order to control said write operation and said read operation, and the method comprising: providing a dummy column of dummy memory cells associated with said array, said dummy column including at least one dummy bit line to which said dummy memory cells are connected, the dummy memory cells including a plurality of loading dummy memory cells for providing a load to said at least one dummy bit line, and at least one write timing dummy memory cell coupled to a dummy word line; during said write operation, activating each of said at least one write timing dummy memory cell via the dummy word line, and controlling a voltage on the at least one dummy bit line so as to cause a state flip condition to occur within said at least one write timing dummy memory cell; and on occurrence of the state flip condition, issuing a write terminate signal to the control circuitry to terminate the write operation.

Viewed from a third aspect, the present invention provides memory device comprising: an array of memory cell means arranged into a plurality of rows and columns and having a plurality of word line means and a plurality of bit line means passing through the array, the memory cell means in each row for activation via a word line signal on the corresponding word line means, and the memory cell means in each column for coupling to an associated at least one bit line means via which data is written into an activated memory cell means of the column during a write operation and data is read from an activated memory cell means of the column during a read operation; control means for controlling signals supplied to the word line means and bit line means of the array in order to control said write operation and said read operation; a dummy column of dummy memory cell means associated with said array, said dummy column including at least one dummy bit line means for connecting to said dummy memory cell means, the dummy memory cell means including a plurality of loading dummy memory cell means for providing a load to said at least one dummy bit line means, and at least one write timing dummy memory cell means for coupling to a dummy word line means; dummy write driver means for coupling to said at least one dummy bit line means; the control means, during said write operation, for activating each of said at least one write timing dummy memory cell means via the dummy word line means; the dummy write driver means, during said write operation, for controlling a voltage on the at least one dummy bit line means so as to cause a state flip condition to occur within said at least one write timing dummy memory cell means; and write detection means, on occurrence of the state flip condition, for issuing a write terminate signal to the control means to terminate the write operation.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
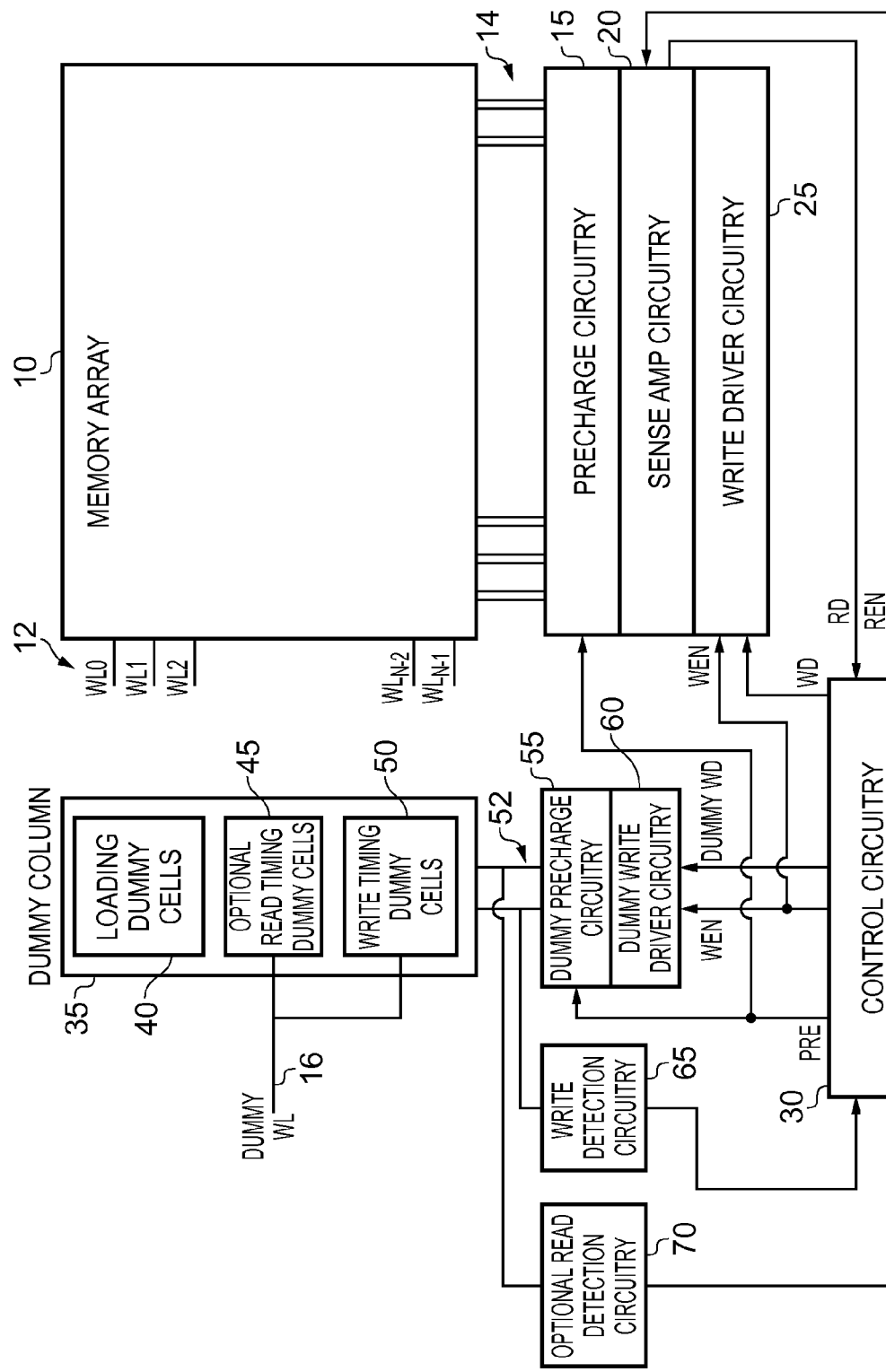
FIG. 1 is a block diagram of a memory device in accordance with one embodiment.

FIG. 1 is a block diagram of a memory device in accordance with one embodiment. In a conventional manner, the memory device includes a memory array 10 comprising an array of memory cells arranged into a plurality of rows and columns. A plurality of word lines 12 are provided through the array in order to allow individual rows of memory cells to be addressed. In addition, a plurality of bit line pairs 14 are provided in association with each of the columns of memory cells. Each column is coupled to an associated bit line pair to enable data to be written into an activated memory cell of the column during a write operation, and for data to be read from an activated memory cell of the column during a read operation. Precharge circuitry 15 is used to precharge the voltage levels on the bit lines 14 under the control of control circuitry 30. Following the precharge operation, a write operation or a read operation can be performed. For a write operation, the control circuitry 30 will cause the write driver circuitry 25 to control the voltages on the bit lines 14, in order to cause the required data values to be written into the memory cells of an addressed row (the addressed row being that row whose associated word line signal is set). For a read operation, the sense amplifier circuitry 20 will be triggered under the control of the control circuitry 30 in order to evaluate the voltages on the bit lines 14 following a predetermined read period after which the addressed memory cells have been activated. In particular, during the read operation, the addressed memory cells will selectively discharge one of their associated bit lines, dependent on the data value stored therein, and by evaluating the voltages on those bit lines at a predetermined point in time after the bit lines have begun to be selectively discharged by the addressed memory cells, the sense amplifier circuitry 20 can determine the data held within the addressed memory cells.

In accordance with the described embodiments, a dummy column 35 is provided in association with the memory array 10, in one embodiment the dummy column including memory cells of the same type as used within the memory array 10, and the various word lines 12 also running through the dummy column 35. However, in addition a dummy word line 16 is provided for selectively activating certain of the dummy memory cells within the dummy column 35, as will be discussed in more detail later.

Various types of dummy memory cells are provided within the dummy column 35. In particular, a plurality of loading dummy cells 40 are provided to provide a load to at least one of the dummy bit line pair 52 running through the dummy column 35. In addition, write timing dummy cells 50 are provided, which are also coupled to the dummy bit lines 52, but which are activated under the control of the dummy word line 16. Furthermore, in an optional embodiment described later with reference to FIGS. 5 and 6, one or more read timing dummy cells 45 may also be provided, which are activated under the control of the dummy word line 16 during a read operation.

As will be discussed in more detail later, dummy precharge circuitry 55 is provided in association with the dummy column 35, and dummy write driver circuitry 60 is also provided for driving a voltage onto one of the dummy bit lines 52 during a write operation in order to cause a switch in the internal stored state of the write timing dummy cells 50. Both the dummy precharge circuitry 55 and the dummy write driver circuitry 60 are controlled by the control circuitry 30.

Write detection circuitry 65 is also provided, for monitoring the voltage on one of the dummy bit lines 52 in order to detect a state switch occurring within the write timing dummy cells 50 during the write operation. This state switch condition (also referred to herein as a state flip condition) then causes the write detection circuitry 65 to generate a write terminate signal to the control circuitry 30, to indicate to the control circuitry that the write operation can now be terminated. In particular, by the time the control circuitry terminates the write operation in dependence on the write terminate signal, it can be assumed that the slowest memory cell within the addressed memory cells has had sufficient time to update its internal contents based on the voltages on its associated bit lines in order to reflect the write data provided from the write driver circuitry 25, and accordingly it is safe to turn off the write enable signal, de-assert the write data, and begin the next precharge operation. Standard mechanisms can be used by the control circuitry 30 upon receipt of the write terminate signal from the write detection circuitry 65, in order to turn off the word line drivers responsible for asserting word lines within the memory array 10. For example, one simple and quick approach is to cause the shared word line clock signal to be deactivated.

In the optional embodiment to be discussed later with reference to FIGS. 5 and 6, read detection circuitry 70 is also provided for monitoring the voltage on one of the dummy bit lines 52, that voltage transitioning due to the operation of the read timing dummy cells 45 during the read operation. The read detection circuitry detects that transition and issues a read terminate signal to the control circuitry 30 in order to indicate that the read operation can be terminated. This signal can then be used to trigger the sense amplifier circuits 20 to sample the voltages on the bit lines 14 in order to detect the data stored within the addressed memory cells, thereby completing the read operation.

Figure 2:
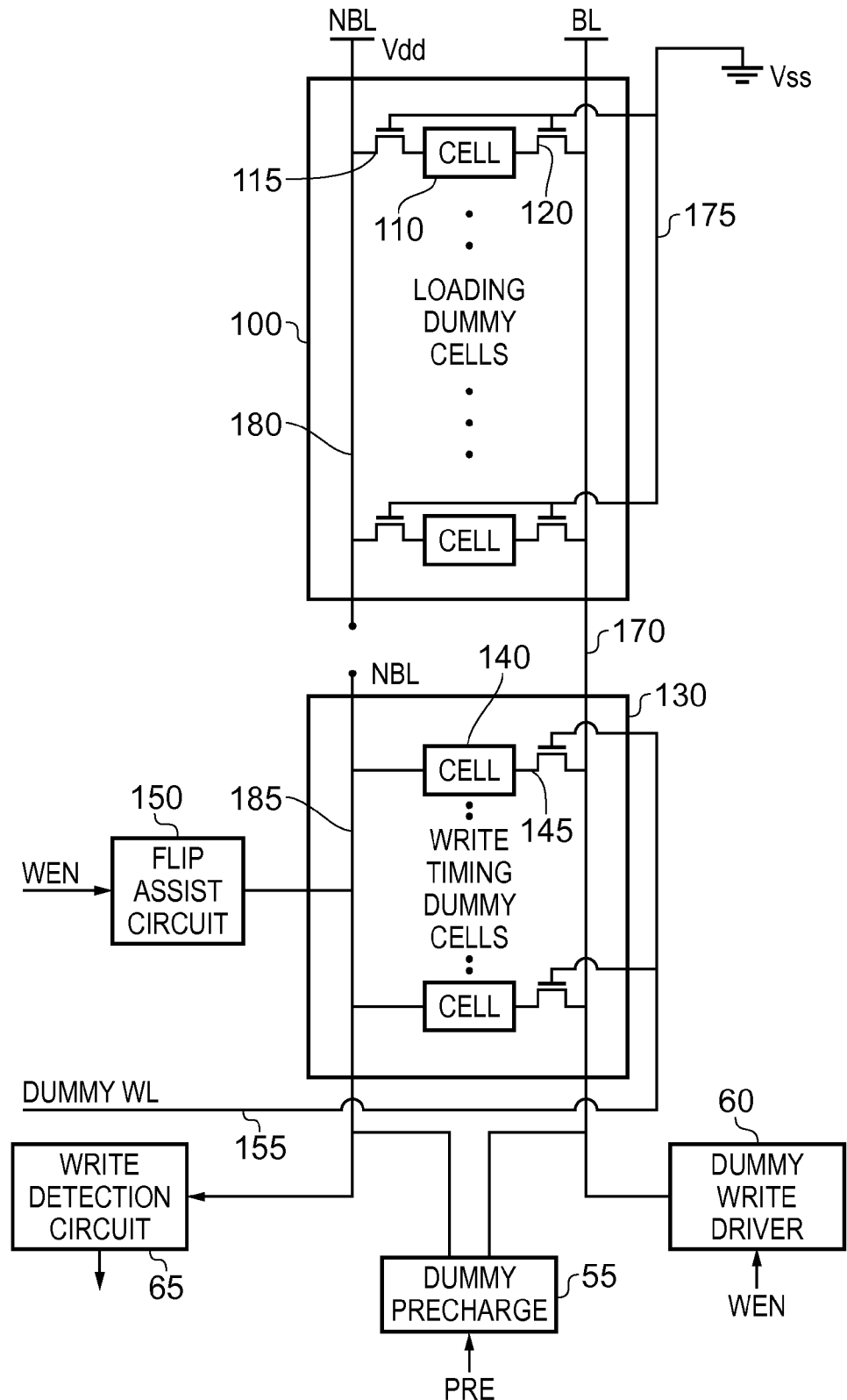
FIG. 2 is a block diagram schematically illustrating components provided within the dummy column of FIG. 1 in accordance with one embodiment.

FIG. 2 illustrates in more detail components provided within the dummy column 35 in accordance with one embodiment. In particular, as shown, a plurality of loading dummy cells 100 are provided connected to both the first dummy bit line 170 and to a second portion 180 of the second dummy bit line. In one embodiment, the second portion of the second dummy bit line is tied to a predetermined voltage, for example Vdd.

In one embodiment, each loading dummy memory cell comprises a group of transistors 110 for storing data and two pass gates 115, 120. In one particular embodiment, a 6T SRAM memory cell is used, and accordingly there will be four transistors within the cell 110 for storing a data value. In one embodiment, the gates of both pass transistors 115, 120 are tied to the ground line 175 in order to permanently turn off the loading dummy cells. As a result, the loading dummy cells merely provide a representative load to the bit line 170 dependent on their stored contents.

In addition to the loading dummy cells 100, the dummy column 35 also includes one or more write timing dummy cells 130, each write timing dummy cell being connected to the dummy bit line 170 and to a first portion 185 of the second dummy bit line. In one embodiment, these write timing dummy cells include the same transistor components as the loading dummy cells, and accordingly in one embodiment are formed from 6T SRAM cells. However, as shown in FIG. 2, whilst the four transistors forming the basic storage cell 140 are configured in the standard way, one of the pass gates is bypassed in order to cause the storage cell 140 to be permanently connected to the first portion 185 of the second dummy bit line. The other pass gate 145 has its gate connected to a dummy word line 155. By bypassing one of the pass gates, this avoids the nmos delay associated with that pass gate, which is not part of the write. Instead such an approach enables a detection as to when the inner nodes of the core cell flips without any extra delay due to that pass gate.

The dummy write driver 60 is connected to the first dummy bit line 170, whilst the write detection circuit 65 is connected to the first portion 185 of the second dummy bit line. During a precharge operation, the dummy precharge circuit 55 precharges the first bit line 170 and the first portion 185 of the second bit line to opposing voltage levels. For example, in one embodiment, the first bit line 170 is precharged to a logic one level, and the first portion 185 of the second bit line is precharged to a logic zero level.

During the subsequent write operation, the dummy write driver 60 is then enabled in order to drive the voltage on the first bit line towards its opposing voltage level. Hence, considering the earlier example, if the bit line 170 is precharged to the logic one level, the dummy write driver 60 will drive the voltage level on that bit line towards the logic zero level during the write operation. At the same time, the dummy word line 155 turns on the pass gate 145 of each write timing dummy cell in order to connect the storage cells 140 to the bit line 170. As a result, the driving of the voltage on the bit line 170 towards the logic zero level will cause the state inside the cells 140 to flip, which in turn will cause the voltage on the first portion 185 of the second bit line to be driven upwards towards the logic one voltage level. This transition will be detected by the write detection circuit 65, and result in the generation of a write terminate signal to the control circuitry 30 to trigger the end of the write operation.

The number of write timing dummy cells provided is programmable at design time. By connecting more than one write timing dummy cell in parallel between the bit lines, it is possible to increase the drive current that those write timing dummy cells produce during the write operation, and hence increase the speed with which the first portion 185 of the second bit line transitions from the logic zero level towards the logic one level. In one particular implementation, it has been found that the use of two write timing dummy cells provides a suitable write drive current during the write operation. In addition, flip assist circuitry 150 can be triggered during the write operation to assist the write timing dummy cells in transitioning the voltage on the first portion 185 of the second bit line. The flip assist circuit 150 however needs to be configured so that it does not have sufficient drive strength in itself to cause the transition of the voltage on the first portion 185 of the second bit line, in order to ensure that the transition does arise as a result of the change in state within the write timing dummy cells.

Whilst in one embodiment the first 185 and second 180 portions of the second bit line could be connected together, the speed of the write detection operation is significantly increased by decoupling the second bit line into the two portions shown.

Figure 3:
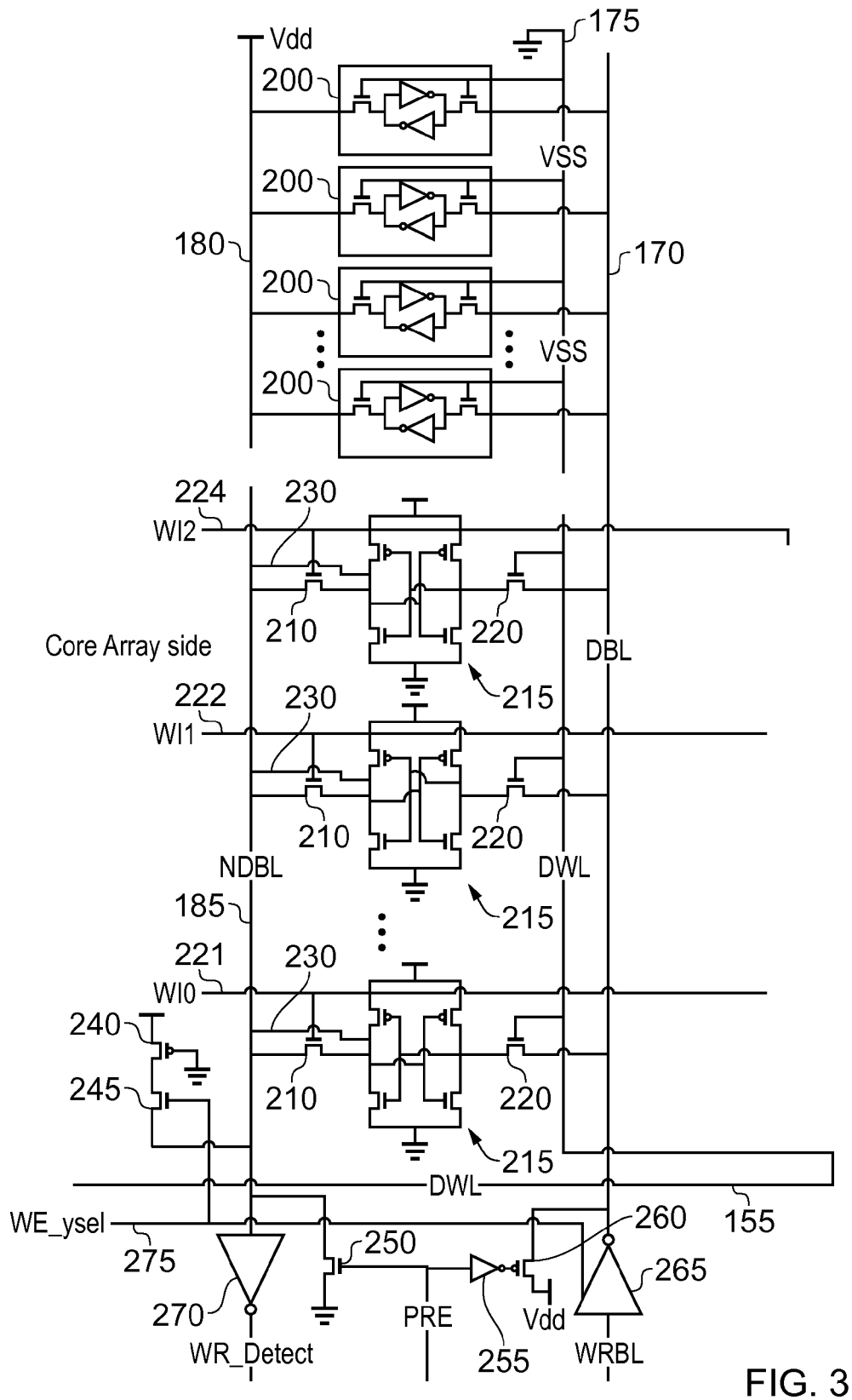
FIG. 3 illustrates in more detail the components of the dummy column illustrated in FIG. 2 in accordance with one embodiment.

FIG. 3 provides a more detailed illustration of the dummy column 35 illustrated schematically in FIG. 2. Each of the loading dummy cells 200 has the form discussed earlier with reference to FIG. 2, and as shown both of its pass gates are coupled to the ground supply 175. In this example, the second portion 180 of the second bit line is tied to the Vdd supply, whilst the voltage on the first bit line 170 is controlled by the precharge circuitry and by the dummy write driver circuitry.

As also shown in FIG. 3, the four transistors 215 within the 6T SRAM cells of each write timing dummy cell are constructed in the standard manner. However, the pass gate 220 is connected to the dummy word line 155 rather than the normal word line 221, 222, 224, running through the memory array 10. Whilst the other pass gate 210 is connected to the standard word line, it is effectively bypassed via the use of the permanent wire connection 230 between one internal storage node of the write timing dummy cell and the first portion 185 of the second bit line.

The precharge circuitry takes the form of the transistor 250, the inverter 255 and the transistor 260. As will be appreciated by those skilled in the art, when the precharge signal is asserted high, this turns on the NMOS transistor 250 in order to draw the voltage on the first portion 185 of the second bit line towards the ground potential. At the same time, the PMOS transistor 260 is also turned on via the inverter 255, in order to pull the voltage on the first bit line 170 to the Vdd supply.

The dummy write driver circuitry takes the form of a tristate inverter 265, which during the precharge operation is turned off due to the write enable y select (WE_ysel) signal 275 not being asserted.

Following the end of the precharge operation, the two transistors 250, 260 of the precharge circuitry are turned off, to thereby decouple the precharge circuitry from the bit lines. The WE_ysel signal over path 275 is then asserted in order to turn on the tristate inverter 265. The tristate inverter receives as an input a logic one value, and accordingly begins to drive the voltage on the bit line 170 towards the logic zero level.

The dummy word line signal is then asserted over path 155 in order to turn on the pass gates 220, and accordingly couple the memory cells 215 to the first bit line 170. As discussed earlier, these memory cells are also permanently connected to the first portion 185 of the second bit line via the connections 230. The exact timing of the assertion of the dummy word line signal can be varied as desired, dependent on implementation. For example, the write circuitry can be time shifted to avoid "feedback delays". The exact write operation is duplicated by the dummy column but the dummy word line does not have to be asserted at the same time as the real word line. Instead a shift earlier in time to equal the delta in time between detection by the write detection circuitry 65 and the actual word line off point can be subtracted from the time domain by asserting the dummy word line earlier. This approach is possible due to the load and slews being modelled correctly by the dummy column of the described embodiment.

As a result, as the voltage drops on the bit line 170, the transistors within the memory cells 215 that were initially turned off begin to conduct and cause the stored state within the memory cells to flip. During this operation, the voltage on the first portion 185 of the second bit line also begins to rise due to the change in state within the memory cells, this rise in the voltage being detected by the write detection circuitry, which in this embodiment takes the form of the inverter 270 (which can be a regular, skewed, inverter or a more complex amplifier).

As an optional feature, flip assist circuitry can be provided in the form of the two transistors 240, 245. In the example of FIG. 3, the transistor 240 is permanently on, but the transistor 245 is only turned on when the WE_ysel signal is asserted. At that time, these transistors serve to weakly pull the first portion 185 of the second bit line towards the Vdd supply, thus assisting the memory cells 215 in transitioning the voltage on that bit line. However, by the Vt drop over the NMOS transistor 245, it or an equivalent flip assist circuit should be arranged to ensure that whilst it conditions the line 185, it does not itself flip the inverter or amplifier 270.

In one embodiment, routing of the dummy word line is designed carefully so as to model the proper word line delay within the dummy word line. In one example embodiment the RC is captured with a simple routing of a decode or control signal which travels the length of the array, for example half up and half down, and then translates that delay into the dummy word line.

Hence, as shown schematically in FIG. 3, the dummy word line 155 follows a path through the memory array so as to replicate a propagation delay of the asserted word line signal to the most distant memory cell in an addressed row of the memory array 10. In one particular embodiment, the dummy word line passes halfway along the width of the memory array and then returns before providing an input to the gates of the pass transistors 220.

As discussed previously, the loading dummy cells 40 within the dummy column 35 are provided to provide a representative load for the bit line 170, in order to replicate a load that may be observed within the columns of the memory array 10. The actual load on a column within the memory array will be dependent on the data values stored within the various memory cells coupled to that column. Hence, the time taken to perform a write operation within the addressed memory cell of that column will vary dependent on what data values are already stored in the other, non-addressed, memory cells of that column. In order to replicate a worst case timing for the write operation, it is desirable to store within the loading dummy cells 40 data values that will serve to inhibit the transition of the voltage on the bit line 170 being driven by the write driver circuitry. In one embodiment, this can be achieved using the arrangement of loading dummy cell illustrated schematically in FIG. 4A.

Figure 4A:
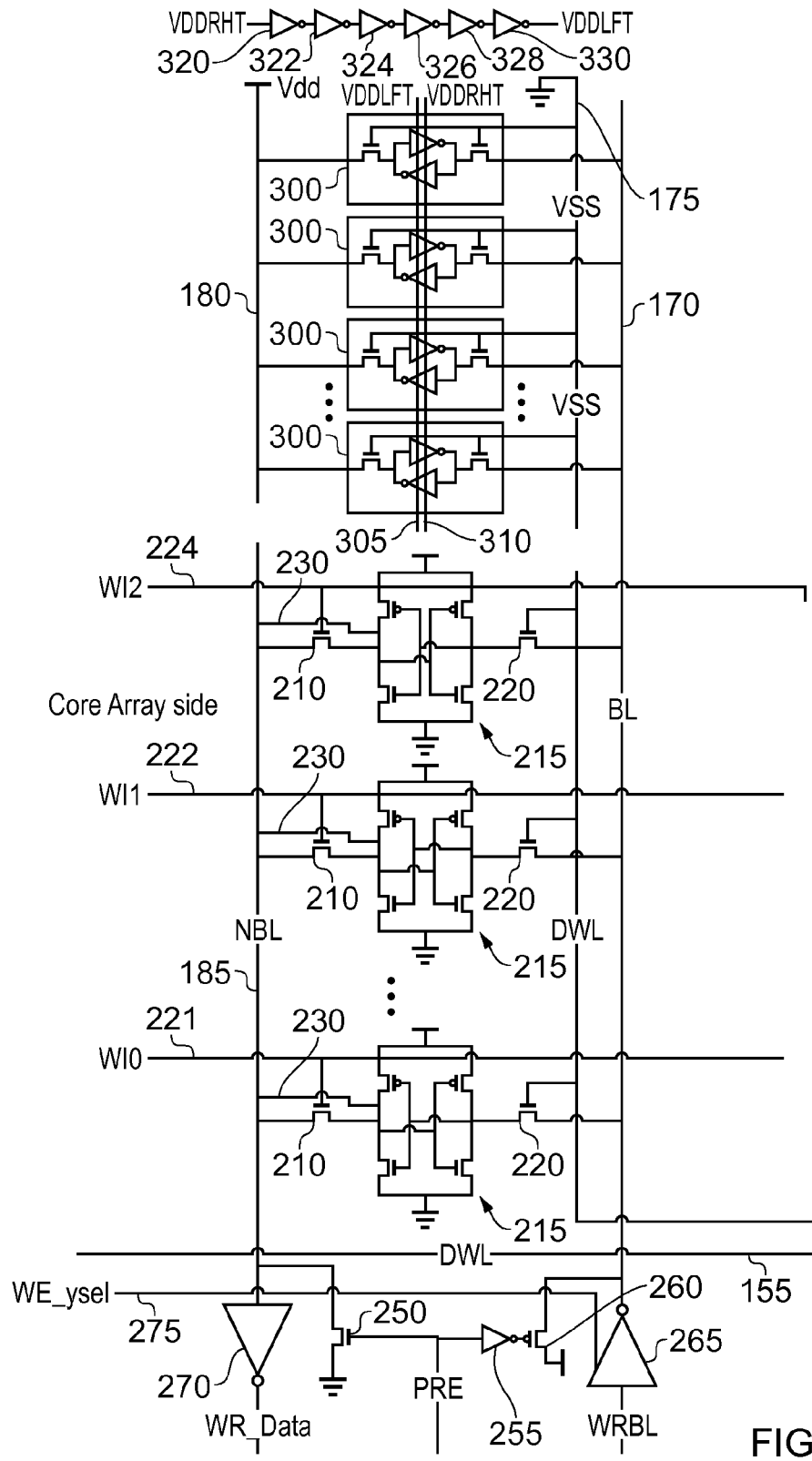
FIGS. 4A and 4B illustrate an alternative embodiment where dual supply voltages are provided to the loading dummy memory cells to allow control of the data value stored into those loading dummy memory cells, in accordance with one embodiment.

The dummy column illustrated in FIG. 4A is essentially of the same construction as discussed earlier with reference to FIG. 3. However, to illustrate the optional nature of the flip assist circuitry 150; in the example of FIG. 4A this flip assist circuitry (which was formed by the transistors 240, 245 in the example of FIG. 3) is omitted. However, it will be understood that it can be added if desired.

Figure 4B:
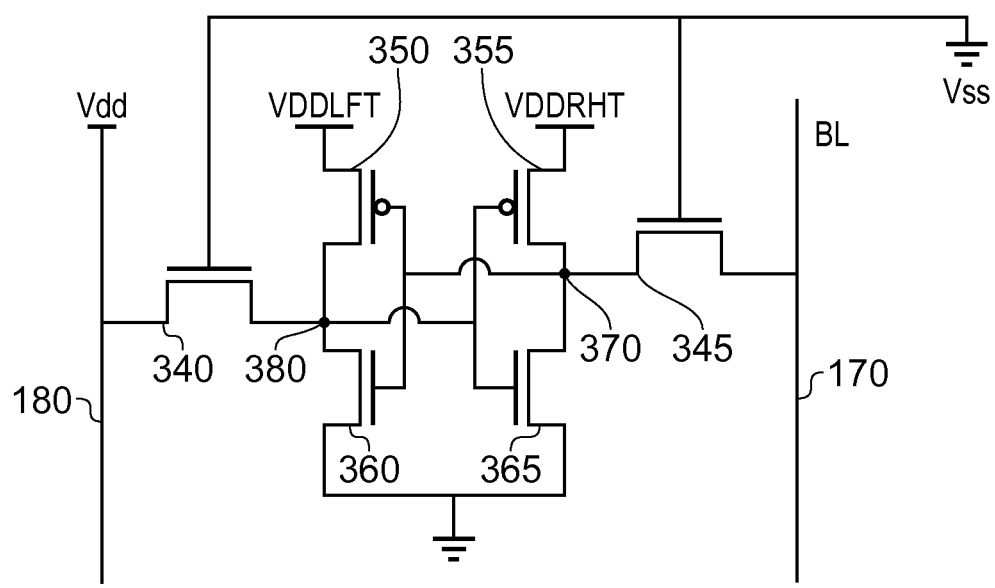

As shown in FIG. 4A, each loading dummy cell 300 is provided by a 6T SRAM cell, but where that memory cell is provided with two phase shifted voltage supplies. In particular, the voltage supply VDDLFT is a delayed version of the voltage supply VDDRHT, the delay being introduced by the chain of inverters 320, 322, 324, 326, 328, 330. The way in which these two voltage supplies are provided to the 6T SRAM cells forming the dummy cells is illustrated schematically in FIG. 4B. In particular, it can be seen that the PMOS transistor 350 and NMOS transistor 360 are connected in series between the VDDLFT supply and ground, whilst the PMOS transistor 355 and NMOS transistor 365 are connected in series between the supply VDDRHT and ground. As discussed previously, both of the pass gates 340, 345 have their gates connected to ground in order to permanently turn off those pass gates. By appropriate driving of the VDDLFT and VDDRHT supplies, it is possible to ensure that a logic one value is written at the node 370, and a logic zero value at the node 380, in each of the loading dummy cells. As a result, when the dummy write driver circuitry 265 starts to drive the voltage level on the bit line 170 towards the logic zero level, the state stored within each loading dummy cell will serve to resist that transition, and hence represent the worst case driving conditions for the write operation. Further, even if a few of the cells are internally offset or defective, and hence do not initialise to the above-described state, the design is tolerant to that, and in addition the probability of failures to such a degree is small and hence tolerable.

Figure 5:
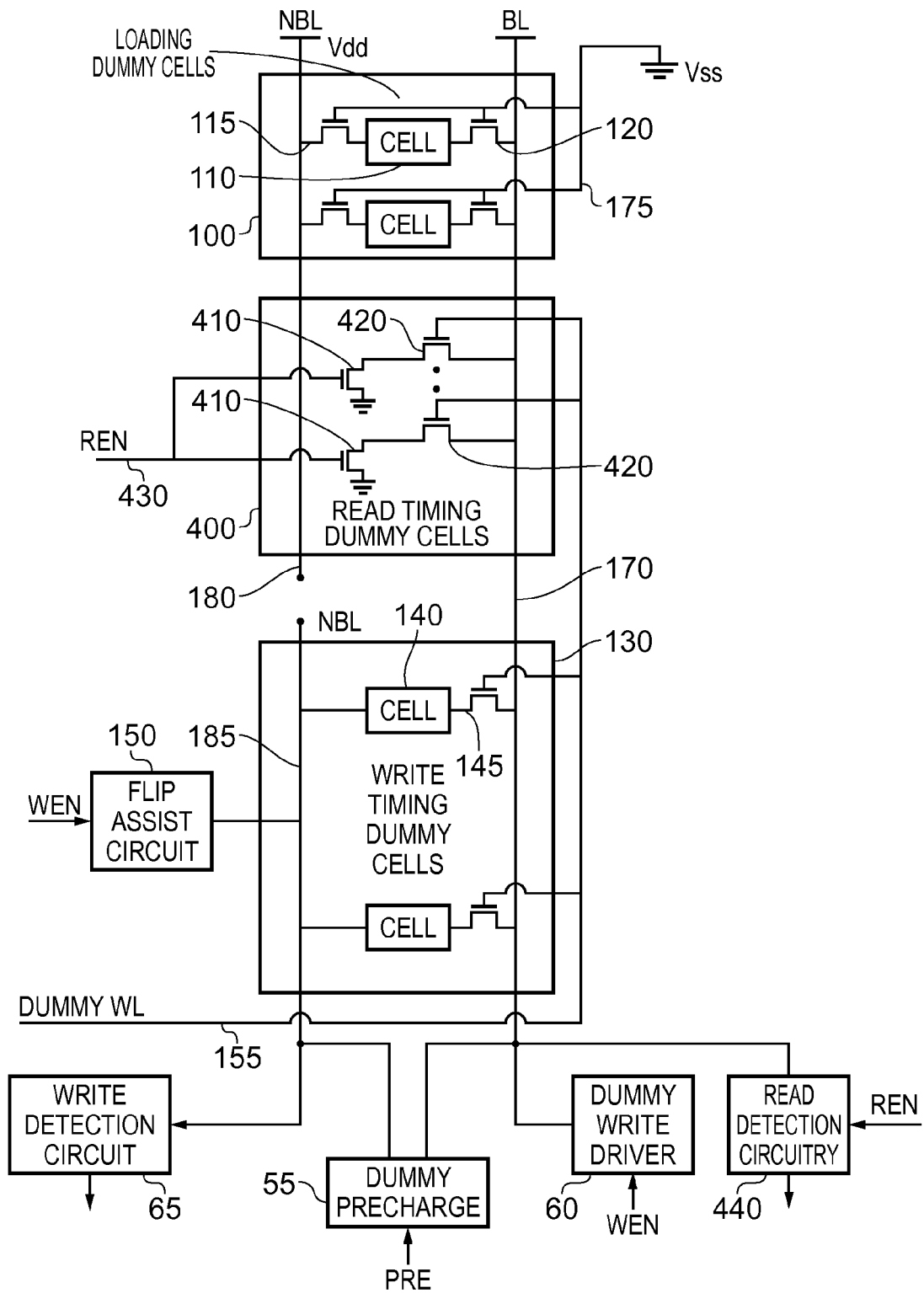
FIG. 5 is a block diagram schematically illustrating components provided within the dummy column of FIG. 1 in accordance with an alternative embodiment.

FIG. 5 schematically illustrates a construction of dummy column 35 in accordance with an alternative embodiment, where in addition to the write timing dummy cells 130, a number of read timing dummy cells 400 are provided. In particular, whilst each read timing dummy cell may be formed from a 6T SRAM cell, four of the transistors are disabled, leaving just two transistors 410, 420 connected in series between the bit line 170 and ground. In one embodiment, the transistor 410 is formed by one of the pull down transistors, and the transistor 420 is formed by one of the pass gate transistors.

The dummy precharge circuitry 55 operates as described earlier, and accordingly during the precharge stage charges the bit line 170 to a logic one level. During a read operation, the dummy word line 155 is asserted, and the read enable signal on path 430 is asserted, as a result of which both transistors 410, 420 turn on and begin to discharge the bit line 170 towards the ground level. The read detection circuit 440 is then activated by the read enable signal to monitor the voltage on the dummy bit line 170, and when that bit line has transitioned by a predetermined amount towards the logic zero level, the read detection circuit 440 generates a read terminate signal which is issued to the control circuitry 30 in order to control the operation of the sense amplifier circuits 20.

Figure 6:
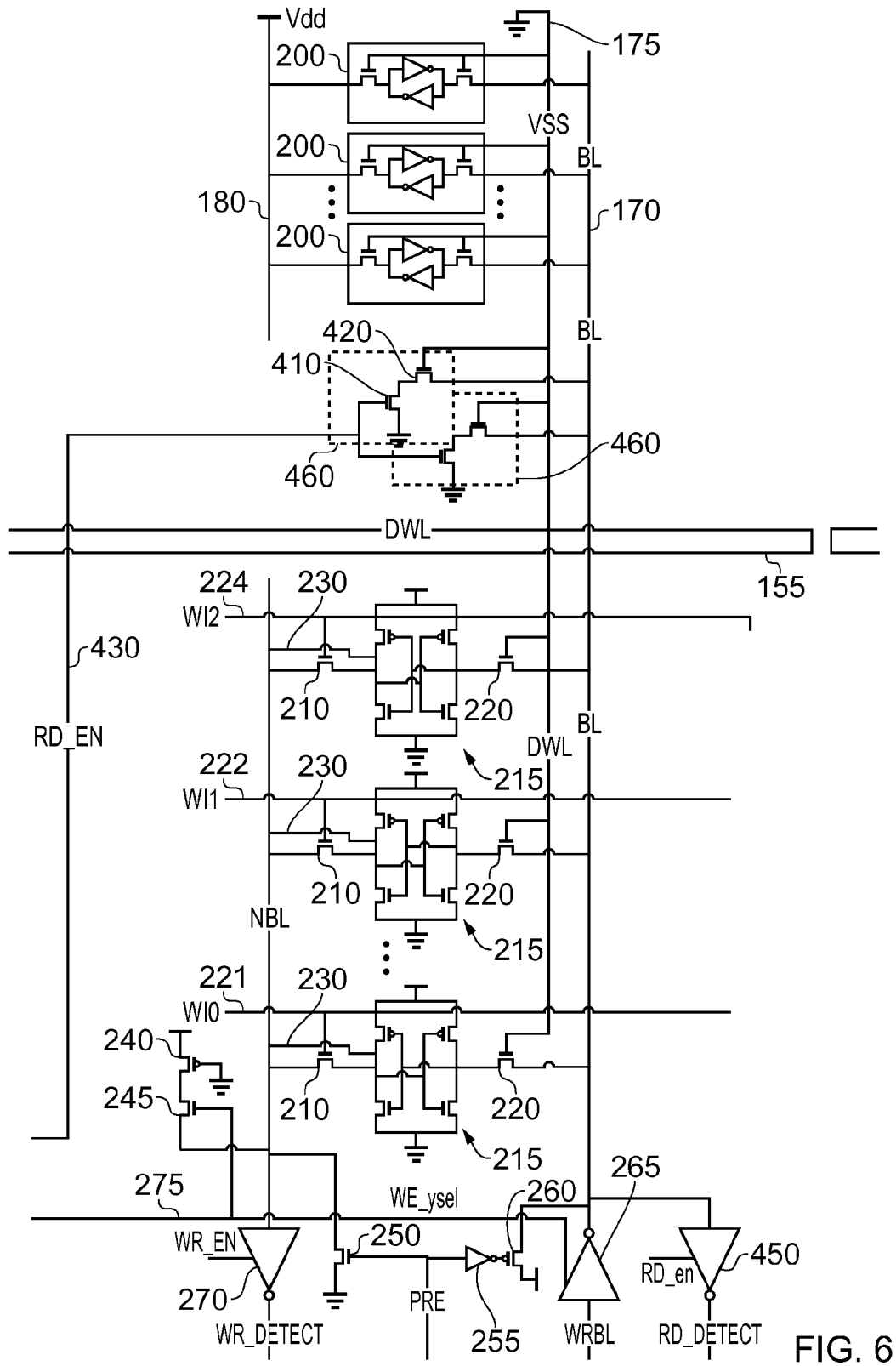
FIG. 6 illustrates in more detail the components provided within the dummy column of FIG. 5 in accordance with one embodiment.

FIG. 6 is a diagram illustrating in more detail one implementation of the dummy column illustrated in FIG. 5. As will be appreciated from a comparison of FIG. 6 with FIG. 3, the loading dummy cells and write timing dummy cells are constructed in the same manner as discussed earlier with reference to FIG. 3. As shown, the read detection circuit 440 takes the form of the inverter 450 connected to the first bit line 170. Each of the read timing dummy cells 460 is constructed as discussed earlier with reference to FIG. 5.

In another embodiment, it is also possible to use the read timing dummy cells of FIG. 5 or 6 with the form of loading dummy cells shown in FIG. 4A, allowing the loading dummy cells to be initialized to a desired state.

From the above described embodiments, it will be appreciated that such embodiments provide an accurate way of tracking the characteristics of a write operation within a memory array so as to provide an accurate self-timed mechanism for determining when a write operation has completed. The operation of the dummy column mimics very accurately the characteristics of the real write operation occurring within the memory array, and in particular tracks the analog effects that occur due to the flipping of state within bit cells. The loading dummy cells provide a realistic loading for the dummy bit lines to accurately capture the bit cell flipping characteristics that occur within the actual memory array when performing write operations.

Further, the dummy column arrangement described in the embodiments can be tuned at design time, providing a mechanism that is readily applicable in the memory compiler space. In particular, at the memory compiler stage, various features of the dummy column can be tuned having regard to the actual memory instance to be created. For example, the number of write timing dummy cells provided within the column can be tuned, the strength of the flip assist circuitry can be tuned, the length of the bit line connected to the write timing dummy cells can be tuned, the data value stored within the loading dummy cells can be tuned, etc. This provides a very flexible mechanism for creating a write self-timed path to accurately track the timing of write operations within the memory array.

In addition the dummy column arrangement can also be tuned post design time, for example at runtime. As an example, some extra control logic could increase or decrease the number of pulldown transistors used to implement the write timing dummy cells during the dummy write operation.

Furthermore, as described with reference to FIGS. 5 and 6, in one embodiment, self-timed read timing can also be achieved using components provided within the dummy column, hence providing a very efficient mechanism for providing both self-timed write functionality and self-timed read functionality.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. A memory device comprising:
an array of memory cells arranged into a plurality of rows and columns and having a plurality of word lines and a plurality of bit lines passing through the array, the memory cells in each row being activated via a word line signal on the corresponding word line, and the memory cells in each column being coupled to an associated at least one bit line via which data is written into an activated memory cell of the column during a write operation and data is read from an activated memory cell of the column during a read operation;
control circuitry configured to control signals supplied to the word lines and bit lines of the array in order to control said write operation and said read operation;
a dummy column of dummy memory cells associated with said array, said dummy column including at least one dummy bit line to which said dummy memory cells are connected, the dummy memory cells including a plurality of loading dummy memory cells for providing a load to said at least one dummy bit line, and at least one write timing dummy memory cell coupled to a dummy word line;
dummy write driver circuitry coupled to said at least one dummy bit line;
the control circuitry being configured, during said write operation, to activate each of said at least one write timing dummy memory cell via the dummy word line, and to cause the dummy write driver circuitry to control a voltage on the at least one dummy bit line so as to cause a state flip condition to occur within said at least one write timing dummy memory cell; and
write detection circuitry configured, on occurrence of the state flip condition, to issue a write terminate signal to the control circuitry to terminate the write operation.

2. A memory device as claimed in claim 1, wherein:
said at least one dummy bit line comprises first and second dummy bit lines;
the dummy write driver circuitry is connected to said first dummy bit line; and
said write detection circuitry is connected to said second dummy bit line.

3. A memory device as claimed in claim 2, further comprising:

dummy precharge circuitry configured to precharge said first dummy bit line to a first voltage level and said second dummy bit line to a second voltage level;

the dummy write driver circuitry being configured during said write operation to drive said first dummy bit line towards said second voltage level; and the write detection circuitry being configured to detect said state flip condition by detecting when a change in the internal stored state of said at least one write timing dummy memory cell causes the voltage on said second dummy bit line to transition from said second voltage level towards said first voltage level.

4. A memory device as claimed in claim 3, further comprising flip assist circuitry configured to assist the at least one write timing dummy memory cell in transitioning the voltage on said second dummy bit line towards said first voltage level.

5. A memory device as claimed in claim 2, wherein:
said second dummy bit line is separated into first and second portions, the first portion being connected to said at least one write timing dummy memory cell, and the second portion being connected to said plurality of loading dummy memory cells; and
said write detection circuitry is connected to said first portion of the second dummy bit line.

6. A memory device as claimed in claim 2, wherein:
each dummy memory cell is a six transistor (6T) SRAM cell including first and second pass gates for coupling the memory cell to said first and second dummy bit lines; and
each write timing dummy memory cell is configured to have its first pass gate controlled by a signal on the dummy word line to connect the write timing dummy memory cell to the first dummy bit line during the write operation.

7. A memory device as claimed in claim 6, wherein each write timing dummy memory cell is configured to have its second pass gate bypassed such that the write timing dummy memory cell is permanently connected to the second dummy bit line.

8. A memory device as claimed in claim 6, wherein:
each loading dummy memory cell has both of its first and second pass gates permanently turned off so that the stored state within that loading dummy memory cell is not affected by the voltage on the first and second dummy bit lines.

9. A memory device as claimed in claim 1, further comprising:
state control circuitry configured to supply dual supply voltages to the plurality of loading dummy memory cells and to control the supply voltage values of said dual supply voltages in order to set the data values stored in the plurality of loading dummy memory cells to act as a worst case load condition on the at least one dummy bit line during the write operation.

10. A memory device as claimed in claim 1, wherein the number of write timing dummy memory cells provided in the dummy column is programmable at design time.

11. A memory device as claimed in claim 1, wherein:
said dummy memory cells include at least one read timing dummy memory cell coupled to said dummy word line;
the control circuitry being configured, during said read operation, to activate each of said at least one read timing dummy memory cell via a signal on the dummy word line and a read enable signal;
said at least one read timing dummy memory cell being configured, when activated, to cause a voltage on said at least one dummy bit line to transition from a first voltage level towards a second voltage level;

the memory device further comprising read detection circuitry configured, on detection of the voltage on said at least one dummy bit line transitioning towards said second voltage level during said read operation, to issue a read terminate signal to the control circuitry to terminate the read operation.

12. A memory device as claimed in claim 11, wherein:
each read timing dummy memory cell comprises a six transistor (6T) SRAM memory cell having four transistors disabled, such that the remaining two transistors are coupled in series between said at least one dummy bit line and said second voltage level;
dummy precharge circuitry is configured to precharge said at least one dummy bit line to said first voltage level prior to the read operation; and
during said read operation, one of the remaining two transistors is turned on by the read enable signal and the other of the remaining two transistors is turned on by the signal on the dummy word line.

13. A memory device as claimed in claim 11, further comprising:
state control circuitry configured to supply dual supply voltages to the plurality of loading dummy memory cells and to control the supply voltage values of said dual supply voltages in order to set the data values stored in the plurality of loading dummy memory cells to act as a worst case load condition on the at least one dummy bit line during the read operation.

14. A memory device as claimed in claim 11, wherein the number of read timing dummy memory cells provided in the dummy column is programmable at design time.

15. A memory device as claimed in claim 1, wherein said dummy word line is routed so as to provide a delay in propagation of an activation signal to the at least one write timing dummy memory cell having regard to a worst case propagation delay of a corresponding activation signal sent to an addressed memory cell within the array.

16. A method of controlling timing of a write operation within a memory device comprising an array of memory cells arranged into a plurality of rows and columns and having a plurality of word lines and a plurality of bit lines passing through the array, the memory cells in each row being activated via a word line signal on the corresponding word line, and the memory cells in each column being coupled to an associated at least one bit line via which data is written into an activated memory cell of the column during a write operation and data is read from an activated memory cell of the column during a read operation, the memory device further having control circuitry for controlling signals supplied to the word lines and bit lines of the array in order to control said write operation and said read operation, and the method comprising:
providing a dummy column of dummy memory cells associated with said array, said dummy column including at least one dummy bit line to which said dummy memory cells are connected, the dummy memory cells including a plurality of loading dummy memory cells for providing a load to said at least one dummy bit line, and at least one write timing dummy memory cell coupled to a dummy word line;
during said write operation, activating each of said at least one write timing dummy memory cell via the dummy word line, and controlling a voltage on the at least one dummy bit line so as to cause a state flip condition to occur within said at least one write timing dummy memory cell; and on occurrence of the state flip condition, issuing a write terminate signal to the control circuitry to terminate the write operation.

* * * * *